United States Patent
Kraemer et al.

(10) Patent No.: US 9,304,175 B2
(45) Date of Patent: Apr. 5, 2016

(54) MAGNETORESISTIVE SENSOR DEVICE AND METHOD OF FABRICATING SUCH MAGNETORESISTIVE SENSOR DEVICE

(75) Inventors: Arne Kraemer, Hamburg (DE); Reinhard Buchhold, Dresden (DE)

(73) Assignee: NXP B.V., Eindhoven (NL)

( * ) Notice: Subject to any disclaimer, the term of this patent is extended or adjusted under 35 U.S.C. 154(b) by 1793 days.

(21) Appl. No.: 12/278,981

(22) PCT Filed: Feb. 13, 2007

(86) PCT No.: PCT/IB2007/050466
§ 371 (c)(1),
(2), (4) Date: Aug. 11, 2008

(87) PCT Pub. No.: WO2007/096806
PCT Pub. Date: Aug. 30, 2007

(65) Prior Publication Data
US 2009/0058413 A1    Mar. 5, 2009

(30) Foreign Application Priority Data
Feb. 23, 2006 (EP) .................................. 06110312

(51) Int. Cl.
G01R 33/09 (2006.01)
H01L 21/00 (2006.01)
B82Y 25/00 (2011.01)

(52) U.S. Cl.
CPC ................. *G01R 33/09* (2013.01); *B82Y 25/00* (2013.01); *G01R 33/093* (2013.01); *G01R 33/096* (2013.01)

(58) Field of Classification Search
CPC ............................ G01R 33/096; G01R 33/093
USPC ....................................................... 324/252
See application file for complete search history.

(56) References Cited

U.S. PATENT DOCUMENTS 3,408,573 A * 10/1968 Wullkopf et al. ............. 335/297
4,600,202 A * 7/1986 Schaeffler et al. ............ 277/355
6,118,624 A    9/2000 Fukuzawa et al.

(Continued)

FOREIGN PATENT DOCUMENTS

CN    1598609 A    3/2005
EP    0905523 A2   3/1999

(Continued)

OTHER PUBLICATIONS

CN1598609 Machine Translation CIPO p. 1-57.*
S Tumanski, "Thin Film Magnetoresistive Sensors". Institute of Physics Publishing, 2001, p. 45-52. Bristol, UK.

*Primary Examiner* — Thomas F Valone
(74) *Attorney, Agent, or Firm* — Rajeev Madnawat

(57) ABSTRACT

In order to further develop a magnetoresistive sensor device (100; 100'; 100") comprising at least one substrate or wafer (10), in particular at least one silicon wafer, and at least one sensing element (30), in particular at least one A[nisotropic] M[agneto]R[esistive] sensing element and/or—at least one G[iant]M[agneto]R[esistive] sensing element, for example at least one multilayer G[iant]M[agneto]R[esistive] sensing element, said sensing element (30) being arranged on and/or under the substrate or wafer (10), as well as a corresponding method of fabricating such magnetoresistive sensor device (100; 100'; 100") in such way that an external or extra bias magnetic field to preset the sensing element (10) and/or the magnetoresistive sensor device (100; 100'; 100") can be dispensed with, it is proposed to arrange at least one magnetic layer (20*t*, 20*b*) on (20*t*) and/or under (20*b*) the substrate or wafer (10) and at least partially on (20*t*) and/or under (20*b*) the sensing element (30), said magnetic layer (20*t*, 20*b*) providing at least one bias magnetic field.

11 Claims, 1 Drawing Sheet

(56) References Cited

U.S. PATENT DOCUMENTS

| | | |
|---|---|---|
| 6,426,620 B1 | 7/2002 | Taguchi et al. |
| 6,667,493 B2 | 12/2003 | Ooshima |
| 6,790,378 B2 * | 9/2004 | Graham et al. ............ 252/62.53 |
| 2002/0075722 A1 | 6/2002 | Ooshima |
| 2004/0115478 A1 * | 6/2004 | Qian et al. .................... 428/692 |
| 2004/0130323 A1 | 7/2004 | Oohashi et al. |
| 2004/0196028 A1 * | 10/2004 | Schroeder et al. ....... 324/207.22 |

FOREIGN PATENT DOCUMENTS

| | | |
|---|---|---|
| EP | 1498744 A2 | 1/2005 |
| JP | 04152688 | 5/1992 |
| WO | 9913519 A1 | 3/1999 |
| WO | 02099451 A2 | 12/2002 |

* cited by examiner

MAGNETORESISTIVE SENSOR DEVICE AND METHOD OF FABRICATING SUCH MAGNETORESISTIVE SENSOR DEVICE

FIELD OF THE INVENTION

The present invention relates to a magnetoresistive sensor device comprising
- at least one substrate or wafer, in particular at least one silicon wafer, and
- at least one sensing element, in particular
  - at least one A[nisotropic]M[agneto]R[esistive] sensing element or
  - at least one G[iant]M[agneto]R[esistive] sensing element, for example at least one multilayer G[iant]M[agneto]R[esistive] sensing element,
- said sensing element being arranged on or under the substrate or wafer.

The present invention further relates to a gradiometer, magnetometer or sensor for measuring the field strength of a magnetic field to be measured, in particular for measuring the time gradient of a magnetic field to be measured.

The present invention further relates to a method of fabricating such magnetoresistive sensor device.

BACKGROUND OF THE INVENTION

Magnetoresistive sensors are used among other things for the measurement of magnetic fields. Typically, the characteristic of the anisotropic magnetoresistive sensor is linearized with so-called barber poles. In this case, a magnetic bias field is necessary to stabilize the magnetoresistive sensor. On the other hand, for sensors based on the (multilayer) G[iant]M[agneto]R[esistive] effect a bias field is necessary to shift the working point in the linear range. The simplest way to realize this is to put an external magnet near to the magnetoresistive layer—typically at the package.

This implies some major disadvantages: There is the necessity of specialized packages for magnetoresistive rotational speed sensors or—if a standard I[ntegrated]C[ircuit] package is used—dimensioning and mounting of a magnet by the customer.

Additionally, there are known quality and yield issues like misplacing or damage of the magnet during assembly. Also the volume of external magnets cannot be shrunk below a certain minimum.

In other words, an A[nisotropic]M[agneto]R[esistive] sensor and a (multilayer) G[iant]M[agneto]R[esistive] sensor need an extra bias magnetic field to preset the sensor. Conventionally, this bias magnetic field is supplied by an external device, for instance by a permanent magnet or by a field generator.

In principle, the fabrication of thin magnetic layers is already known (cf. for example S. Tumanski, Thin Film Magnetoresistive Sensors, pages 45 to 52, Institute of Physics Publishing, 2001, Bristol, and references therein).

Prior art document JP 04-15 26 88 proposes to use a magnetic paste to create a permanent magnet which is deposited on the chip mounting lead frame.

Prior art document US 2004/0130323 A1 discloses the manufacture of a (spin valve) G[iant]M[agneto]R[esistive] sensor comprising a free layer and a pinned layer; a bias magnetic field layer is magnetized in the desired direction.

However, prior art document US 2004/0130323 A1 does not refer to multilayer G[iant]M[agneto]R[esistive] sensors and not to the used materials or to the actual fabrication of the magnetic layers; additionally, prior art document US 2004/0130323 A1 reveals only special magnetic configurations during the process of magnetizing for providing various magnetization orientations on wafer level.

Finally, regarding the technological background of the present invention, further reference can be made to
- prior art document U.S. Pat. No. 6,118,624 wherein an additional hard magnetic layer is arranged between the G[iant]M[agneto]R[esistive] layers of the magnetoresistive element so as to provide a bias magnetic field; however, this magnetic layer is not screen-printed on the magnetoresistive sensor and cannot be magnetized after having been provided on the magnetoresistive sensor;
- prior art document U.S. Pat. No. 6,426,620 B1 disclosing a G[iant]M[agneto]R[esistive] sensor combined with electrical circuitry onto one carrier;
- prior art document WO 99/13519 A1 revealing a permanent magnet material in etched recesses for a magnetoresistive device; and
- prior art document WO 02/099451 A2 proposing the providing and determining of various magnetization orientations during the manufacture of the magnetoresistive sensor.

OBJECT AND SUMMARY OF THE INVENTION

Starting from the disadvantages and shortcomings as described above and taking the prior art as discussed into account, an object of the present invention is to further develop a magnetoresistive sensor device of the kind as described above in the technical field, a gradiometer, magnetometer or sensor of the kind as described above in the technical field as well as a method of the kind as described above in the technical field in such way that an external or extra bias magnetic field to preset the sensing element and/or the magnetoresistive sensor device can be dispensed with.

The present invention is principally based on the idea of integrating at least one "intrinsic" bias magnet into at least one semiconductor package or sensor package of the magnetoresistive sensor; more particularly, for miniaturization purposes it is proposed to integrate the bias magnetic field onto the magnetoresistive sensor by adding at least one additional or extra magnetically hard layer with permanent magnetic field characteristics; thereby, an external or extra bias magnetic field to preset the magnetoresistive sensor is not required.

Principally, the integration of the bias magnet can be done with at least one anisotropic hard magnetic layer which is deposited by means of thin film technology above or underneath the magnetoresistive sensor. However, with such anisotropic magnetic layer, the magnetic field direction cannot be changed any more after deposition. A compensation of a magnetic offset is therefore not possible. Furthermore, such anisotropic magnetic layers typically have to be structured by etching processes after deposition.

For these reasons, according to an advantageous embodiment of the present invention at least one magnetically isotropic and/or magnetizable paste can be used, based for example
- on (anisotropic) ferrite powder, such as on bariumhexaferrite powder or on strontiumhexaferrite powder, or
- on any other (anisotropic) hard magnetic powder, such as on rare earth compounds.

The fabrication of such powder of bariumhexaferrite or of strontiumhexaferrite can be done among others by glass crystallization technique. Random mixing of the anisotropic powder gives an (overall) isotropic behavior of the paste.

Expediently, the ferrite powder can then be admixed to an appropriate polymer or glass solder in order to get a screen-printable paste.

According to a particularly inventive refinement of the present invention, the magnetizable paste can be screen-printed onto the silicon wafer with the sensors; in this context, the magnetizable paste can be printed onto the top side and/or onto the back side of the sensor wafer. It will be appreciated by a man skilled in the art that a further structuring of the paste is not necessary.

After annealing of the paste, the magnetoresistive sensor can be further processed. In particular, the magnetoresistive sensor can be diced, molded and magnetized. Expediently, it is possible to compensate magnetic offsets because the magnetic field direction can be chosen arbitrarily within the sensor plane and can be changed by remagnetization. After packaging, the magnetizable paste can be magnetized in any direction within the sensor plane.

Compared to prior art document JP 04-15 26 88, the magnetizable paste can be printed directly on top of the sensor crystal; thereby, the magnetic film is closer to the sensor by more than two orders of magnitude compared to the magnetic film of prior art document JP 04-15 26 88.

Unlike prior art document US 2004/0130323 A1 where only special magnetic configurations during the process of magnetizing (spin valve) G[iant]M[agneto]R[esistive] sensors for providing various magnetization orientations on wafer level are revealed, the present invention discloses a method or process where the magnetization can be performed not on substrate level or on wafer level but on ready-to-use products in respectively one arbitrary direction.

In general, the present invention can be applied for enabling the fabrication of "ready-to-use" gradiometers and/or magnetometers and/or sensors in standard I[ntegrated]C[ircuit] packages which are not to be provided with one or more external magnets or extra magnets.

Also, the integration of A[pplication]S[pecific]I[ntegrated]C[ircuit]s and M[agneto]R[esistive] sensors with magnet in one standard I[ntegrated]C[ircuit] package is possible.

Finally, the present invention relates to the use of at least one magnetoresistive sensor device as described above and/or of the method as described above for at least one gradiometer, magnetometer or sensor as described above, in particular for at least one general purpose gradiometer, magnetometer or sensor based
on A[nisotropic]M[agneto]R[esistive] technology, in particular without pinned layer, or—
on G[iant]M[agneto]R[esistive] technology, for example on multilayer G[iant]M[agneto]R[esistive] technology, in particular without pinned layer,
for at least one linear displacement sensor, and/or
for at least one rotational speed sensor.

Such sensors for measuring the field strength of a magnetic field to be measured, hereinafter referred to as measuring field, can be magnetically influenced and are based on the principle of arrangement in a predetermined alignment with the field lines of the measuring field at the position of the field strength of the measuring field to be measured.

BRIEF DESCRIPTION OF THE DRAWINGS

As already discussed above, there are several options to embody as well as to improve the teaching of the present invention in an advantageous manner. To this aim, references is made to the dependent claims; further improvements, features and advantages of the present invention are explained below in more detail with reference to three embodiments by way of example and to the accompanying drawings where FIG. 1 schematically shows a cross sectional view of a first embodiment of part of a substrate or wafer with two magnetoresistive sensing elements, with magnetizable paste being printed onto the complete top side of the sensing elements;

The same reference numerals are used for corresponding parts in FIG. 1 to FIG. 3.

DESCRIPTION OF EMBODIMENTS

In order to avoid unnecessary repetitions, the following description regarding the embodiments, characteristics and advantages of the present invention relates (unless stated otherwise)

to the first embodiment of the magnetoresistive sensor 100 according to the present invention (cf. FIG. 1) as well as
to the second embodiment of the magnetoresistive sensor 100' according to the present invention (cf. FIG. 2) as well as
to the third embodiment of the magnetoresistive sensor 100" according to the present invention (cf. FIG. 3), all embodiments 100, 100', 100" being fabricated according to the method of the present invention.

Figure 1:
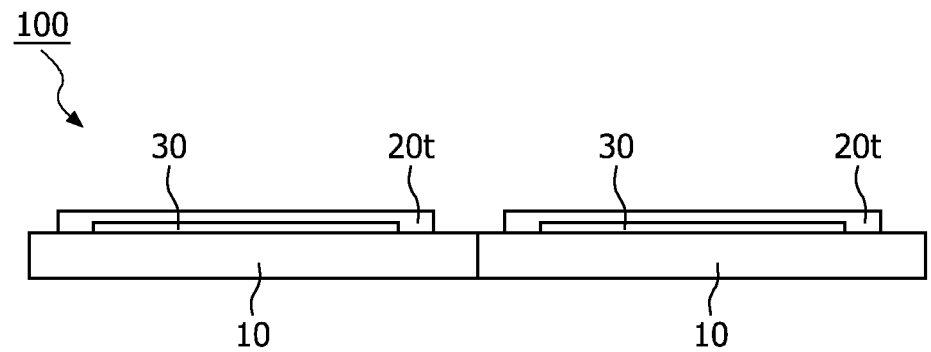
Figure 2:
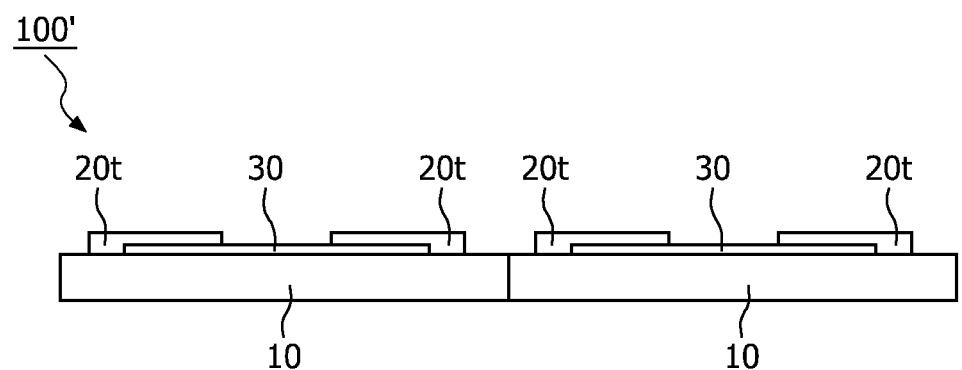
FIG. 2 schematically shows a cross sectional view of a second embodiment of part of a substrate or wafer with two magnetoresistive sensing elements, with magnetizable paste being printed onto respective parts or sections of the top side of the sensing elements.
Figure 3:
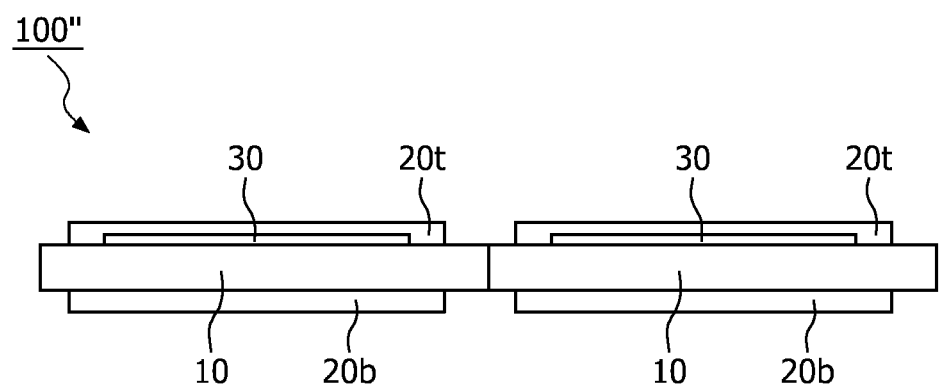
FIG. 3 schematically shows a cross sectional view of a third embodiment of part of a substrate or wafer with two magnetoresistive sensing elements, with magnetizable paste being printed onto the complete top side of the sensing elements as well as onto the back side of the substrate or wafer.

In FIGS. 1, 2, 3, the integration of the bias magnetic field is done with a magnetically isotropic hard layer 20t (cf. FIGS. 1, 2, 3) and/or 20b (cf. FIG. 3), which can be deposited by means of thin film technology or by means of screen-printing
above (cf. FIGS. 1, 2, 3) or
underneath (cf. FIG. 3)

the substrate or wafer 10 wherein the sensing element 30, for example the A[nisotropic]M[agneto]R[esistive] sensing element, is arranged on said substrate or wafer 10.

The magnetically isotropic paste 20t, 20b is based on a magnetizable powder, for example ferrite or rare earth compound. This powder is then admixed to an appropriate polymer or glass solder to get a screen-printable paste 20t, 20b. This paste 20t, 20b is screen-printed onto the substrate wafers 10 with the sensors 30.

The magnetically isotropic paste 20t, 20b can be printed
onto the top side (→reference numeral 20t) of the wafer 10 covering
completely (cf. first embodiment according to FIG. 1 and third embodiment according to FIG. 3) or
partly or sectionally (cf. second embodiment according to FIG. 2) the structures of the sensing elements 30 and/or
onto the back side (→reference numeral 20b) of the wafer 10 opposite (cf. third embodiment according to FIG. 3) of the structures of the sensing elements 30.

A further structuring of the paste 20t, 20b is not necessary.

After annealing of the paste in order to form the magnetic layer 20t, 20b, the sensors 100, 100', 100" can be further processed. In particular, the sensors 100, 100', 100" can be diced, molded and magnetized. It is possible to compensate magnetic offsets because the bias magnetic field direction as provided by the magnetically isotropic hard layer 20t, 20b can be chosen arbitrarily within the plane of the sensor 100, 100', 100" and can be changed by remagnetization.

In this context, an only partial or sectional printing of the magnetically isotropic paste 20t on the top side of the sensor wafer or substrate 10 (cf. second embodiment according to FIG. 2) and/or of the magnetically isotropic paste 20b on the back side of the sensor wafer or substrate 10 can be expedient for supporting the process of changing the bias magnetic field direction and/or for supporting the process of remagnetizing.

The present invention enables the production of ready-to-use multi-purpose gradiometers, magnetometers or sensors in standard I[ntegrated]C[ircuit] packages, the integration of A[pplication]S[pecific]I[ntegrated]C[ircuit]s and M[agneto]R[esistive] sensors with bias magnet into standard I[ntegrated]C[ircuit] packages, and a significant size reduction of existing speed sensor packages.

LIST OF REFERENCE NUMERALS

100 magnetoresistive sensor device, in particular being part of and/or being implemented as gradiometer, as magnetometer or as sensor (=first embodiment according to FIG. 1)

100' magnetoresistive sensor device, in particular being part of and/or being implemented as gradiometer, as magnetometer or as sensor (=second embodiment according to FIG. 2)

100" magnetoresistive sensor device, in particular being part of and/or being implemented as gradiometer, as magnetometer or as sensor (=third embodiment according to FIG. 3)

10 substrate or wafer, in particular silicon wafer

20b magnetically isotropic hard layer or paste on back side of substrate or of wafer 10 (=third embodiment according to FIG. 3)

20t magnetically isotropic hard layer or paste on top side of substrate or of wafer 10

30 sensing element, in particular A[nisotropic]M[agneto]R[esistive] sensing element

The invention claimed is:

1. A method of fabricating a magnetoresistive sensor device, the method comprising:

forming at least one silicon wafer having a first side and a second side, wherein the first side is opposite to the second side;

forming either an AMR sensing element or a multilayer GMR sensing element, said formed sensing element being arranged above the first side of the formed silicon wafer; and forming at least one magnetic layer underneath the second side of the formed silicon wafer and the formed sensing element, said magnetic layer providing at least one bias magnetic field.

2. The method according to claim 1, wherein the magnetizable powder is admixed to a solder to provide a screen-printable paste that is at least partially printed to form the at least one magnetic layer.

3. The method according to claim 1, further comprising:

processing the formed silicon wafer by at least one of dicing, molding, and magnetizing to form the magnetoresistive sensor device.

4. The method according to claim 2, wherein the screen-printable paste completely covers the sensing element.

5. The method according to claim 2, wherein the screen-printable paste sectionally covers the sensing element.

6. The method according to claim 2, wherein the magnetizable powder comprises a ferrite powder.

7. The method according to claim 6, wherein the ferrite powder is a bariumhexaferrite powder.

8. The method according to claim 6, wherein the ferrite powder is a strontiumhexaferrite powder.

9. The method according to claim 2, wherein the magnetizable powder comprises a rare earth compound.

10. The method according to claim 2, wherein the solder is a polymer solder.

11. The method according to claim 2, wherein the solder is a glass solder.

* * * * *